(12) United States Patent
Huang et al.

(10) Patent No.: US 7,464,558 B2
(45) Date of Patent: Dec. 16, 2008

(54) LOW EDDY CURRENT CRYOGEN CIRCUIT FOR SUPERCONDUCTING MAGNETS

(75) Inventors: Xianrui Huang, Clifton Park, NY (US); Paul Shadforth Thompson, Stephentown, NY (US); David Thomas Ryan, Niskayuna, NY (US); Gregory Alan Lehmann, Florence, SC (US); Timothy John Havens, Florence, SC (US)

(73) Assignee: General Electric Company, Niskayuna, NY (US)

( * ) Notice: Subject to any disclaimer, the term of this patent is extended or adjusted under 35 U.S.C. 154(b) by 915 days.

(21) Appl. No.: 10/718,439

(22) Filed: Nov. 19, 2003

(65) Prior Publication Data
US 2005/0104701 A1 May 19, 2005

(51) Int. Cl.
*F25B 19/00* (2006.01)
(52) U.S. Cl. .......................... 62/51.1; 62/47.1
(58) Field of Classification Search ................. 335/216; 62/3.1, 51.1, 47.1
See application file for complete search history.

(56) References Cited

U.S. PATENT DOCUMENTS

| | | | |
|---|---|---|---|
| 5,349,297 A | 9/1994 | DeMeester et al. | 324/318 |
| 5,412,363 A | 5/1995 | Breneman et al. | 335/216 |
| 5,530,355 A * | 6/1996 | Doty | 324/318 |
| 6,029,458 A * | 2/2000 | Eckels | 62/47.1 |
| 6,078,234 A * | 6/2000 | Huang et al. | 335/216 |
| 6,154,109 A * | 11/2000 | Gold | 335/299 |
| 6,255,928 B1 * | 7/2001 | van Oort et al. | 335/301 |
| 6,448,795 B1 * | 9/2002 | Ermakov et al. | 324/724 |

FOREIGN PATENT DOCUMENTS

| | | |
|---|---|---|
| EP | 0681189 A | 4/1995 |
| EP | 0898130 A | 8/1998 |
| JP | 04197059 | 7/1992 |
| JP | 08250324 | 9/1996 |

OTHER PUBLICATIONS

European Search Report for EP application 04257135, Jan. 3, 2005.

* cited by examiner

*Primary Examiner*—Melvin Jones
(74) *Attorney, Agent, or Firm*—Eileen W. Gallagher

(57) ABSTRACT

A low eddy current cryogen circuit for superconducting magnets including at least a first cooling coil made of an electrically conducting material and having at least one electrical isolator incorporated in the first cooling coil. The electrical isolator is located to inhibit induced eddy current loops due to inductive coupling of the first cooling coil with eddy current inducing field sources.

45 Claims, 4 Drawing Sheets

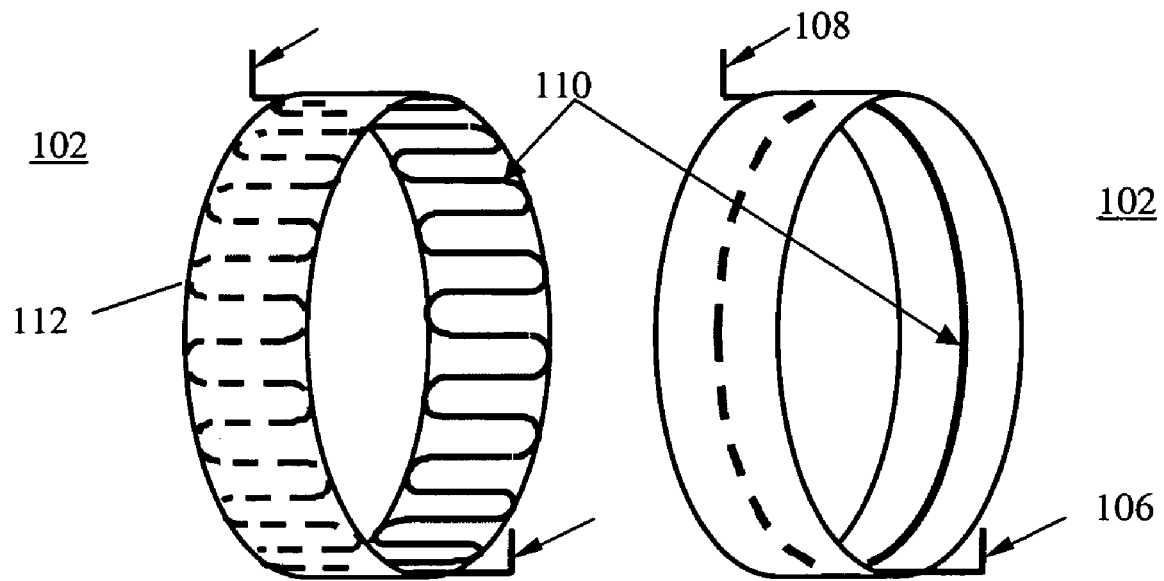
Fig. 2A        Fig. 2B
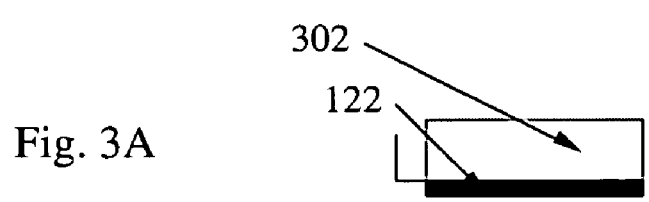
Fig. 3A
Fig. 3B

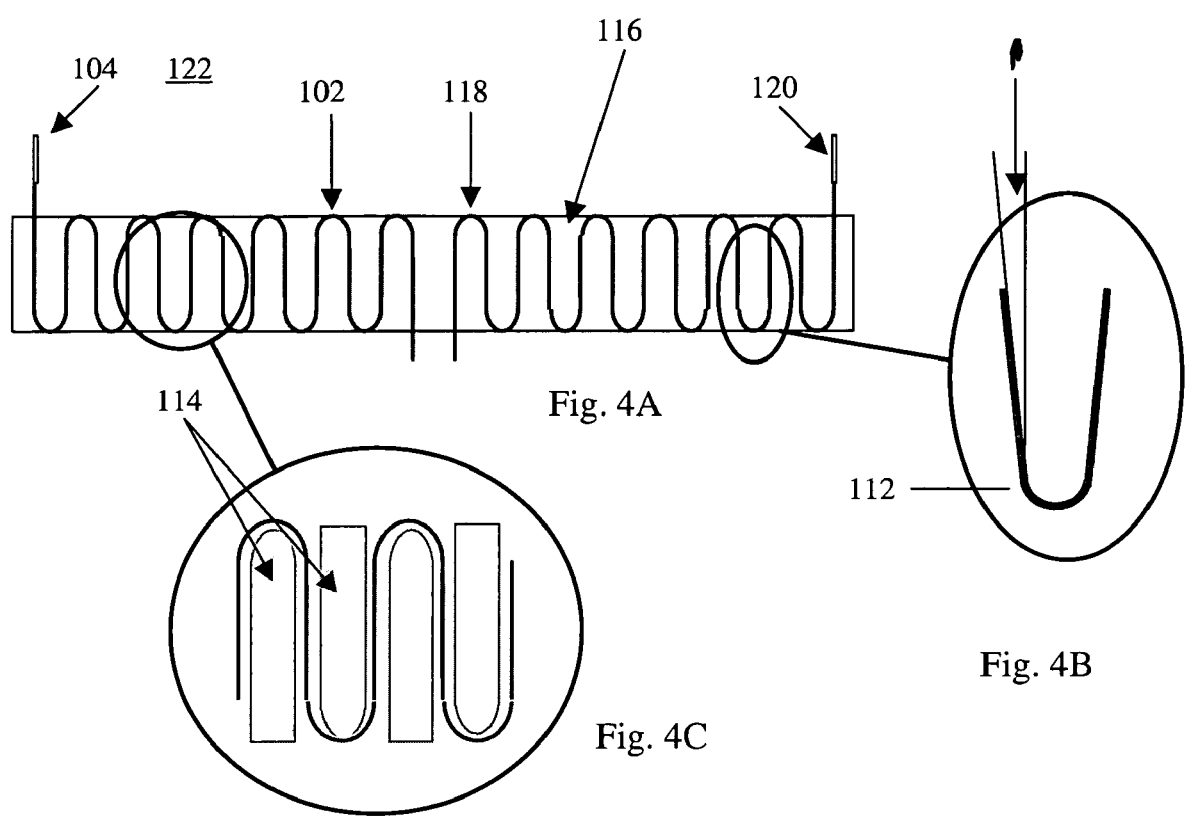

LOW EDDY CURRENT CRYOGEN CIRCUIT FOR SUPERCONDUCTING MAGNETS

BACKGROUND OF THE INVENTION

This invention relates generally to methods and apparatus for cooling a superconducting magnet, and specifically to cooling a magnet used in a magnetic resonance imaging (MRI) system.

There are various magnetic imaging systems which utilize superconducting magnets. One example of an imaging system is a magnetic resonance imaging (MRI) system. MRI systems are used to image a portion of a patient's body.

Superconducting MRI systems typically utilize one superconducting magnet, often with multiple coils. An imaging volume is provided inside the magnet. A person or material is placed into an imaging volume and an image or signal is detected and then processed by a processor, such as a computer.

The majority of existing superconducting MRI magnets are made of a niobium-titanium material which is cooled to a temperature of 4.2 K with a cryostat. A typical superconducting magnet cryostat includes a liquid helium vessel, one or two thermal shields and a vacuum vessel. The thermal shields intercept radiation from the ambient atmosphere to the helium vessel. The heat load from this radiation is balanced with a refrigerator, such as a cryocooler, which provides cooling to the cryostat.

However, in addition to the heat from ambient atmosphere, there may be additional sources of heat. For example, when the cryostat components are exposed to magnetic fields, for instance the fringe field from an MRI gradient coil, eddy currents are produced. These eddy currents generate joule heating which increases the heat load to be removed by the refrigerator. Moreover, the magnetic fields produced by these eddy currents in the image volume generally have adverse impact on the imaging quality of the system. Prior attempts to address this problem consisted of reducing the AC field strength in the area of the superconducting coils and cryogenic components. However, this typically results in an adverse impact on the system performance.

BRIEF SUMMARY OF THE INVENTION

In accordance with one preferred aspect of the present invention, there is provided a low eddy current cryogen circuit for superconducting magnets comprising at least a first cooling coil comprising an electrically conducting material and at least one electrical isolator incorporated in the first cooling coil, the electrical isolator located to inhibit induced eddy current loops in the cryogen circuit due to inductive coupling of the first cooling coil with eddy current inducing field sources.

In accordance with one preferred aspect of the present invention, there is provided a method of cooling a superconducting magnet comprising providing a superconducting magnet in thermal contact with at least a first cooling coil incorporating at least one electrical isolator, the electrical isolator located to inhibit induced eddy current loops due to inductive coupling of the first cooling coil with eddy current inducing field sources and passing a cryogen through the first cooling coil.

In accordance with one preferred aspect of the present invention, there is provided an MRI system comprising a superconducting magnet and a low eddy current cryogen circuit, the low eddy current cryogen circuit having at least a first cooling coil in thermal contact with the superconducting magnet.

In accordance with one preferred aspect of the present invention, there is provided a method of making a cooling band comprising providing a first cooling coil and a second cooling coil, the first and second cooling coils having a substantially semicircular portion and affixing the first and second cooling coils to a flexible backing such that the first and second cooling coils form a substantially circular shape.

BRIEF DESCRIPTION OF THE DRAWINGS

FIG. 2A is a schematic illustration of a cooling band according to an embodiment of the present invention.

FIG. 2B is a schematic illustration of a cooling band according to another embodiment of the present invention.

FIG. 3A is a cross section of a cooling band according to an according to another embodiment of the present invention.

FIG. 3B a cross section of a cooling band according to another embodiment of the present invention.

FIG. 4A is a schematic illustration a method of making a cooling band according to an embodiment of the invention.

FIG. 4B is a detail view of the cooling band of FIG. 4A.

FIG. 4C is another detail view of the cooling band of FIG. 4A.

DETAILED DESCRIPTION OF THE INVENTION

The present inventors have realized that heat generated from eddy current loops in superconducting magnet systems, such as MRI systems, may be reduced without reducing the AC field strength in the area of the superconducting coils and cryogenic components. This can be accomplished through the use of a low eddy current cryogen circuit to cool the superconducting magnet. Specifically, this can be accomplished by providing cooling coils which have a least one electrical isolator incorporated in the cooling coils to inhibit induced magnetic fields due inductive coupling of the cooling coils with eddy current inducing field sources.

Figure 1:
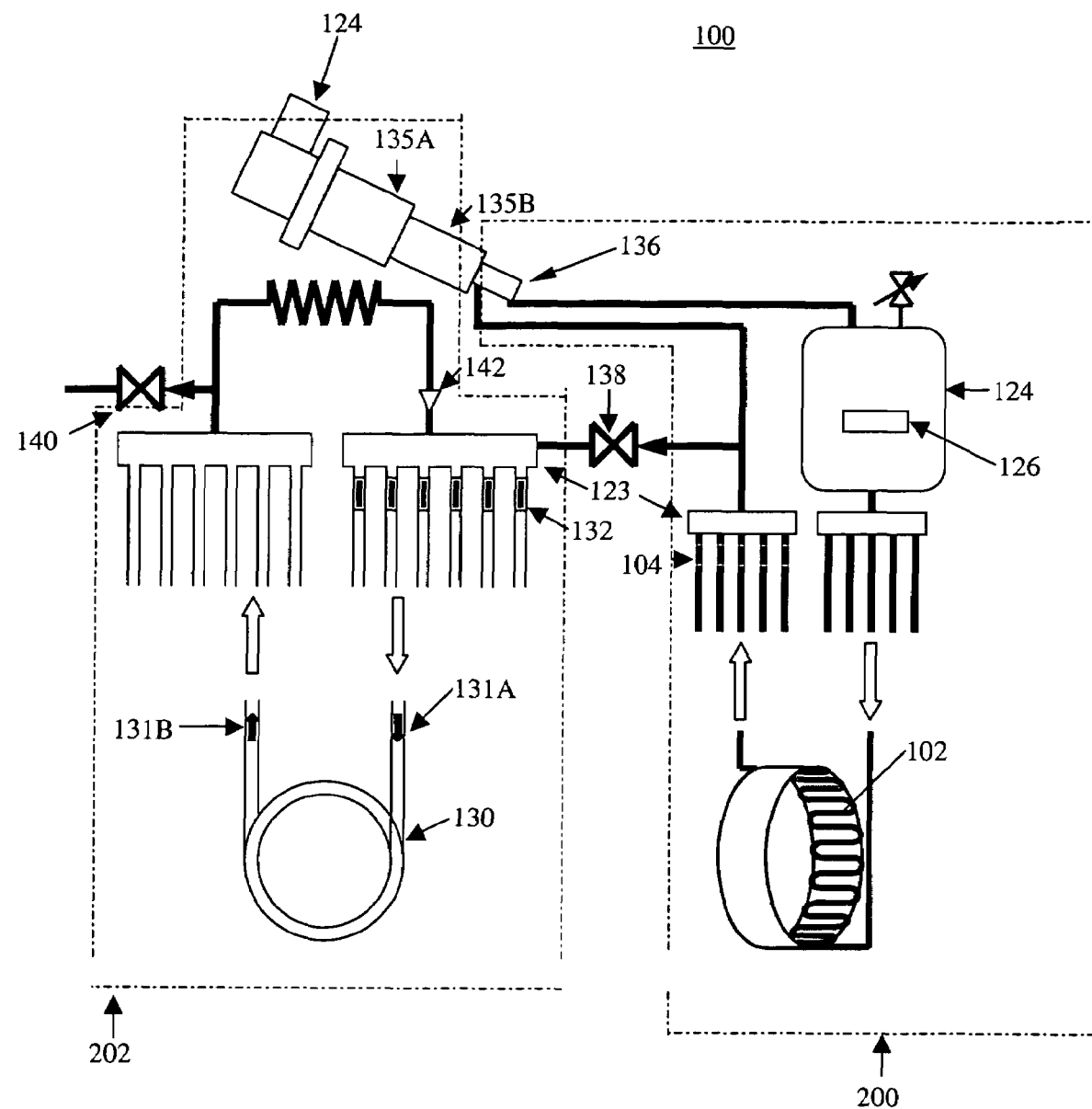
FIG. 1 is a schematic illustration of a low eddy current cryogen circuit illustrating several embodiments of the present invention.

FIG. 1 illustrates several aspects and embodiments of a low eddy current cryogen circuit 100 of the invention. In a preferred embodiment of the invention, the low eddy current cryogen circuit 100 includes at least one cooling coil 102. Typically, the cooling coil 102 is made of stainless steel or copper for ease of constructing a leak-tight circuit suitable for operation at cryogenic temperatures. However, any material having a suitable thermal conductivity may be used.

Typically, materials used for leak-tight cryogenic tubes are also electrically conducting. Because these materials are electrically conducting, eddy currents may be induced in the cooling coil 102 due to inductive coupling of the cooling coil 102 with various electromagnetic field sources, for example magnetic field sources or AC field sources. To inhibit these induced eddy current loops, at least one electrical isolator 104 is incorporated in the cooling coil 102. That is, the cooling coil 102 may fabricated by making a portion of the cooling coil 102 out of a non-electrically conducting material. For example, a portion of the cooling coil 102 may be made of a ceramic tube. By using a ceramic tube, the current path in the cooling coil 102 is interrupted, inhibiting the generation of induced eddy currents.

In one embodiment of the invention illustrated in FIG. 2B, the cooling coil 102 has an input portion 106, an output portion 108 and a semicircular portion 110. Typically, liquid cryogen is introduced to the cooling coil 102 via the input portion 106 at the bottom of the cooling coil 102. As heat is absorbed by the cooling coil 102, a portion of the liquid cryogen vaporizes. The cryogen vapor and any remaining liquid cryogen exits the cooling coil 102 via the output portion 108 at the top of the cooling coil 102.

Figure 5:
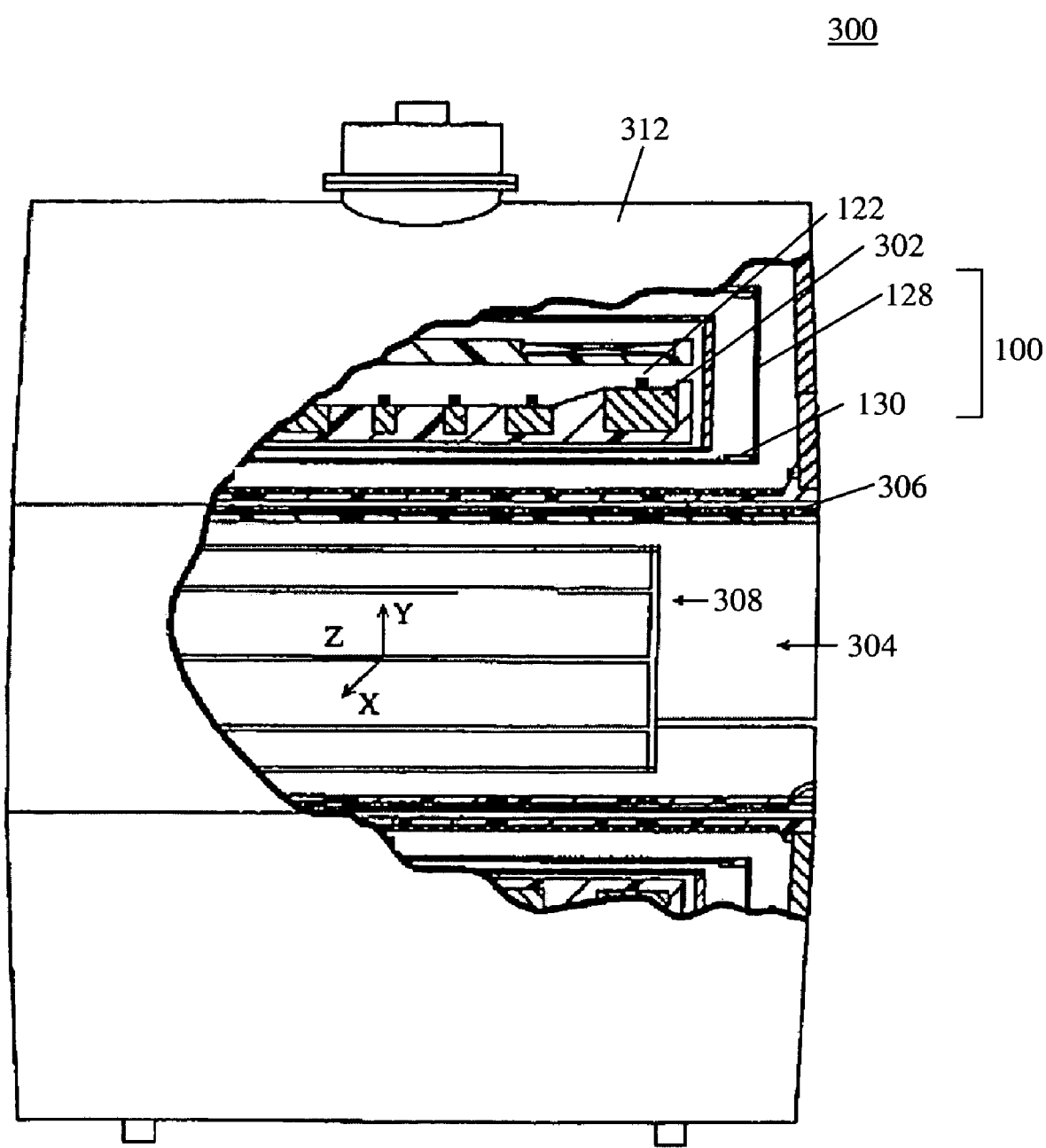
FIG. 5 is a schematic illustration of an MRI according to an embodiment of the present invention.

In one preferred embodiment, the semi-circular portion 110 is designed to cool a superconducting magnet of an MRI 300 (FIG. 5). However, the semi-circular portion may also be designed to cool superconducting magnets in other applications, such as magnetic separators, motors and generators.

FIG. 2A illustrates a cooling coil 102 according another embodiment. In this embodiment, the cooling coil 102 includes a plurality of bends 112 forming a serpentine shape perpendicular to the arc of the semi-circular portion 110. The cooling coil 102 of this embodiment provides cooling for a coil of long axial length while keeping thermal conduction paths within the coil itself short, thereby allowing heat to be removed from such a coil without an unacceptable temperature rise at the ends of the coil.

FIGS. 4A-4C illustrate additional features and embodiments based on the embodiment illustrated in FIG. 2A. Preferably, the bends 112 in the cooling coil 102 are angled such that a gas bubble in a liquid cryogen in the cooling tube 102 would flow upwards under the force of gravity (FIG. 4C). Typically, the angle of the bends 112 is greater than 0 degrees. However as long as the angle at least 0 degrees, i.e. not negative, the gas bubble will not be trapped in the cooling coil 102. Thus, the cooling coil 102 will not suffer vapor lock.

Optionally, filler pieces 114 may be included between the bends 112 in the cooling coil 102. Preferably, the height of the filler pieces is approximately the same as the thickness of the cooling coil 102. Typically, the filler pieces are made a polymeric material, preferably a phenolic polymer. Further, in a preferred embodiment, the cooling coil 102 has a diameter less than about 7 mm. More preferably, the cooling coil 102 has a diameter greater than about 3 mm and less than about 7 mm.

When fabricating the low eddy current cryogen circuit 100 according to the above embodiments of the invention, the cooling coil 102 may be first formed into a semicircular shape and affixed to a backing 116, with or without filler pieces 114. Optionally, the cooling coil 102 and the filler pieces may be affixed to a flexible backing 116 and then bent into a semicircular shape. The backing 116 with the filler pieces 114 and the cooling coil 102 can then be put in thermal contract with a superconducting coil.

The previous embodiments of the invention involved the use of a single cooling coil 102. In another preferred embodiment (illustrated in FIG. 4A), a cooling band 122 is formed with the addition of a second cooling coil 118 having at least a second electrical isolator 120 incorporated in the second cooling coil 118. As with the first cooling coil 102, the second electrical isolator 120 is located to inhibit induced magnetic fields due to inductive coupling of the second cooling coil 118 with eddy current inducing field sources. Further, both the first and second cooling coils 102, 118 have substantially semicircular portion 110. Preferably, the first and second cooling coils 102, 118 are located relative to each other to form a cooling band 122 having a substantially circular shape.

The cooling band 122 can be wrapped around a superconducting coil 302 to provide cooling around the entire circumference of the superconducting coil 302 (FIG. 3A). Further, if the superconducting coil has a long axial length, a plurality of cooling bands 122 can be provided. If a plurality of cooling bands 122 is provided, manifolds 123 (FIG. 1), may also be provided to distribute cryogen among the plurality of cooling bands 122.

In still another embodiment of the invention illustrated in FIG. 3B, at least some of the plurality of cooling bands 122 are incorporated within windings of the superconducting coil 302. This embodiment may be used with thick superconducting coils 302 which may otherwise suffer hot spots within the superconducting coil 302. Further, this embodiment may be combined with the last embodiment. That is, a plurality of cooling bands 122 may be incorporated both within the windings of the superconducting coil 302 and axially along the super conducting coil 302.

In a preferred embodiment of the invention, the low eddy current cryogen circuit 100 includes a liquid cryogen reservoir 124 fluidly connected to the first and second cooling coils 102, 118 of the cooling band 122 (FIG. 1). Preferably, the liquid cryogen reservoir 124 is located above the first and second cooling coils 102, 118 and is fluidly connected to an input portion 106 located at the bottom of the first and second cooling coils 102, 118. With this arrangement, liquid cryogen flows upward through the cooling band 122. This configuration assists the flow of any vapor formed by evaporation of liquid cryogen through the cooling band 122 and inhibits the formation of a vapor lock in the cooling band 122.

In another preferred embodiment, the low eddy current cryogen circuit 100 includes at least one thermal shield 128. The thermal shield 128 intercepts radiation from the ambient atmosphere to the superconducting magnet of a superconducting magnetic device, for example an MRI. Preferably, the thermal shield 128 includes least one thermal shield cooling coil 130 circumscribing the thermal shield 128. Cryogen is introduced to the thermal shield cooling coil 130 via an input portion 131A at one temperature and removed via an output portion 131B at a higher temperature after removing heat from the thermal shield 128. Preferably, like the cooling coils 102, 118 in the cooling bands 122, the thermal shield cooling coil 130 includes at least one electrical isolator 132 inhibit induced magnetic fields due to inductive coupling of the thermal shield cooling coil 130 with eddy current inducing field sources.

In another embodiment, the thermal shield 128 may be circumscribed by a plurality of thermal shield cooling coils 130. If a plurality of thermal shield cooling coils 130 is provided, manifolds 123, may also be provided to distribute cryogen among the plurality of thermal shield cooling coils 130.

Preferably, the low eddy current cryogen circuit 100 includes a cryocooler 134 and a condenser 136 thermally connected to the cryocooler 134. More preferably, the output portion 108 at the top of the cooling coils 102, 118 are fluidly connected to the condenser 136. In this embodiment, vaporized cryogen may be directed to the condenser 136, liquefied, and then sent to the liquid cryogen reservoir 124 to be reused.

In another embodiment of the invention, the cryocooler 134 has two stages 135A, 135B. In this embodiment, the condenser 136 is thermally connected to the second stage 135B of the crycooler 134 while the thermal shield cooling coil 130 is thermally connected to the first stage 135A of the crycooler 134. Further, in this embodiment, the low eddy current cryogen circuit 100 may be described as comprising two subcircuits, a coil cooling subcircuit 200 and a thermal shield subcircuit 202. The coil cooling subcircuit 200 includes the liquid cryogen reservoir 124, the cooling bands 122 and the condenser 136. The thermal shield subcircuit 202 includes the thermal shield cooling coil 130 the first stage 135A of the cryocooler 134.

In a preferred aspect of this embodiment, the coil cooling subcircuit 200 and the thermal shield subcircuit 202 may be connected with a first pressure relief valve 138. If the pressure in the coil cooling subcircuit 200 exceeds a pre-set pressure, cryogen vapor from the coil cooling subcircuit 200 can be released into the thermal shield subcircuit 202. In this manner, the pre-set pressure balances the cooling capacity of the second stage 135B of the cryocooler with the heat load of the from the cooling bands 122.

Optionally, a second pressure relief valve 140 may be included to vent the thermal shield subcircuit 202 to the atmosphere. Thus, if the pressure in the thermal shield subcircuit 202 exceeds a second pre-set pressure, cryogen vapor in the thermal shield subcircuit 202 can be released to the atmosphere to reduce the pressure in the thermal shield subcircuit 202 and hence, reduce the pressure in the low eddy current cryogen circuit 100. Preferably, the pressure in the low eddy current cryogen circuit 100 is always above atmospheric pressure during operation. In this manner, atmospheric pressure will not inhibit operation of the low eddy current cryogen circuit 100 due to ingress of air from outside the low eddy current cryogen circuit 100.

Additionally, a one-way valve 142 may be included between the first stage 135A of the cryocooler and the infeed portion 131A of the thermal shield cooling coil. The one-way valve 142 provides added control over the vapor pressure in the thermal shield subcircuit 202. That is, the one-way valve ensures that cold cryogen flows down to the thermal shield cooling coil 130 and removes heat from the thermal shield 128 during the cool-down procedure and during failure of cooling system due to a power failure or a mechanical failure in the cooling system.

To provide even further control over the pressure in the low eddy current cryogen circuit 100, in another embodiment of the invention, a heater 126 is located inside the cryogen reservoir 124. The heater 126 is turned on whenever the pressure in the cryogen reservoir 124 drops below a pre-set pressure. In this manner, the cooling capacity of the cryocooler 134 can be balanced with the heat load from the cooling bands 122.

FIG. 5 illustrates an MRI system 300 comprising a low eddy current cryogen circuit 100. The MRI system 300 includes several superconducting magnets 302, a thermal shield 128, gradient coils 306, an RF coil 308, and an RF shield 310 within a housing 312. The housing 312 includes a central bore 304 for the patient. In this embodiment, cooling bands 122 are located on an outer surface of the coil of superconducting magnets 302. Additionally, thermal shield coils 130 are located on an outer surface of the two thermal shields 128.

In this embodiment, the cooling bands 122 may include cooling coils 102, 118 having simple semi-circular shapes as illustrated in FIG. 2B or having serpentine bends 112 as illustrated in FIG. 2A. Further, unlike prior art MRI systems which required a cryogen vessel within the housing 312, the present MRI system 300 does not require an internal cryogen vessel. In the MRI system according to the present embodiment, the liquid cryogen reservoir 124 may be located outside of the housing 312 and be connected via pipes or tubing (not shown).

Further, in the event of a power failure or a mechanical failure in the cooling system, the latent heat of the cryogen in the liquid cryogen reservoir 124 is available to provide "ride-through" (the period of time from the failure of the cooling mechanism to the loss of superconductivity due to a rise in temperature above the critical temperature of the superconducting material). During ride through, the pressure in the low eddy current cryogen circuit 100 rises and both pressure relief valves 138, 140 open. Cryogen boiling off the cooling bands 122 flows into the thermal shield subcircuit, through the thermal shiled cooling coil 130 and vents to atmosphere. Preferably, if the cryocooler 134 fails, cryogen in the liquid cryogen reservoir 124 provides latent cooling for ride-through for at least 4 hours. More preferably, cryogen in the liquid cryogen reservoir 124 provides latent cooling for ride-through for at least 12 hours.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept.

What is claimed is:

1. A low eddy current cryogen circuit for superconducting magnets comprising:
    at least a first cooling coil comprising an electrically conducting material; and
    at least one electrical isolator incorporated in the first cooling coil, the electrical isolator located to inhibit induced eddy current loops in the cryogen circuit due to inductive coupling of the first cooling coil with eddy current inducing field sources.

2. The cryogen circuit of claim 1, wherein the electrical isolator comprises a ceramic tube.

3. The cryogen circuit of claim 1, wherein the eddy current inducing field sources include magnetic field sources or AC field sources.

4. The cryogen circuit of claim 1, wherein the first cooling coil has a plurality of bends forming a serpentine shape.

5. The cryogen circuit of claim 4, wherein the bends in the first cooling coil are angled such that a gas bubble in a liquid in the first cooling tube would flow upwards under the force of gravity.

6. The cryogen circuit of claim 4, further comprising filler pieces between the bends in the first cooling coil.

7. The cryogen circuit of claim 6, further comprising a flexible backing, wherein the first cooling coil and the filler pieces are affixed to the flexible backing.

8. The cryogen circuit of claim 1, wherein the first cooling coil has a diameter less less than 7 mm.

9. The cryogen circuit of claim 8, wherein the first cooling coil has a diameter in the range of 3 mm to 7 mm.

10. The cryogen circuit of claim 1, further comprising a second cooling coil having at least a second electrical isolator incorporated in the second cooling coil, the second electrical isolator located to inhibit induced magnetic fields due to inductive coupling of the second cooling coil with eddy current inducing field sources, wherein the both the first and second cooling coils have a substantially semicircular portion and the first and second cooling coils are located relative to each other to form a cooling band having a substantially circular shape.

11. The cryogen circuit of claim 10, further comprising a plurality of cooling bands and a manifold, wherein the manifold is adapted to distribute cryogen among the plurality of cooling bands.

12. The cryogen circuit of claim 11, further comprising a liquid cryogen reservoir fluidly connected to the first and second cooling coils.

13. The cryogen circuit of claim 12, wherein the liquid cryogen reservoir is located above the first and second cooling coils and is fluidly connected to a bottom portion of the first and second cooling coils.

14. The cryogen circuit of claim 13, further comprising a heater located inside the cryogen reservoir.

15. The cryogen circuit of claim 14, further comprising at least one thermal shield.

16. The cryogen circuit of claim 15, further comprising at least one thermal shield cooling coil circumscribing the thermal shield, the at least one thermal shield cooling coil having at least one electrical isolator incorporated in the at least one thermal shield cooling coil and located to inhibit induced magnetic fields due to inductive coupling of the at least one thermal shield cooling coil with eddy current inducing field sources.

17. The cryogen circuit of claim 16, further comprising a cryocooler and a condenser thermally connected to the cryocooler, wherein top portions of the first and second cooling coils are fluidly connected to the condenser.

18. The cryogen circuit of claim 17, wherein the cryocooler comprises two stages, the condenser is thermally connected to the second stage of the crycooler and the thermal shield cooling coil is thermally connected to the first stage of the crycooler.

19. The cryogen circuit of claim 18, wherein the cryogen reservoir, the cooling band and the condenser comprise a coil cooling subcircuit; the thermal shield cooling coil and the first stage of the cryocooler comprise a thermal shield subcircuit, and wherein the cryogen circuit further comprises:
    a first pressure relief valve connecting coil cooling subcircuit and the thermal shield subcircuit;
    a second pressure relief valve venting the thermal shield subcircuit to atmosphere; and
    a one-way valve between the first stage of the cryocooler and an infeed portion of the thermal shield cooling coil.

20. An MRI system comprising a superconducting magnet and the cryogen circuit of claim 1, wherein the cryogen circuit is adapted to cool the superconducting magnet.

21. A method of cooling a superconducting magnet comprising:
    providing a superconducting magnet in thermal contact with at least a first cooling coil incorporating at least one electrical isolator, the electrical isolator located to inhibit induced eddy current loops due to inductive coupling of the first cooling coil with eddy current inducing field sources; and
    passing a cryogen through the first cooling coil.

22. The method of claim 21, further comprising providing a second cooling coil in thermal contact with the superconducting magnet, the second cooling coil incorporating at least a second electrical isolator, the second electrical isolator located to inhibit induced magnetic fields due to inductive coupling of the second cooling coil with eddy current inducing field sources, wherein the both the first and second cooling coils have a substantially semicircular portion and the first and second cooling coils are located relative to each other to form a cooling band having a substantially circular shape.

23. The method of claim 22, wherein passing the cryogen comprises feeding the first and second cooling coils with cryogen from cryogen reservoir located above the cooling band.

24. The method of claim 23, wherein the first and second coils have top and bottom portions and the cryogen is fed into the bottom portions and exits from the top portions.

25. The method of claim 24, wherein the cryogen fed into the bottom portions of the first and second cooling coils is liquid and at least a portion of the cryogen exiting the top portions of the first and second cooling coils is gaseous.

26. The method of claim 25, further comprising directing the gaseous portion of the cryogen to a condenser.

27. The method of claim 26, wherein the condenser is attached to a second stage of a two stage cryocooler.

28. The method of claim 27, further comprising providing a thermal shield circumscribed with at least one thermal shield cooling coil, the at least one thermal shield cooling coil having at least one electrical isolator incorporated in the at least one thermal shield cooling coil and located to inhibit induced magnetic fields due to inductive coupling of the at least one thermal shield cooling coil with eddy current inducing field sources.

29. The method of claim 28, further comprising feeding cryogen into an infeed portion of the thermal shield cooling coil at a first temperature and removing the cryogen from an exit portion of the thermal shield cooling coil at a second temperature, wherein the second temperature is higher than the first temperature.

30. The method of claim 29, further comprising turning on a heater located in the cryogen reservoir if a pressure in the reservoir drops below a predetermined pressure.

31. The method of claim 30, wherein the predetermined pressure balances a cooling capacity of the second stage of the cryocooler with a heat load of the from the cooling band.

32. The method of claim 31, wherein the cryogen reservoir, the cooling band and the condenser comprise a coil cooling subcircuit; the thermal shield cooling coil and the first stage of the cryocooler comprise a thermal shield subcircuit, the cooling subcircuit and the thermal shield subcircuit comprise a low eddy current cryogen circuit and wherein the a low eddy current circuit further comprises:
    a first pressure relief valve connecting coil cooling circuit and the thermal shield circuit;
    a second pressure relief valve venting the thermal shield circuit to atmosphere; and
    a one-way valve between the first stage of the cryocooler and the infeed portion of the thermal shield cooling coil.

33. The method of claim 32, further comprising opening the first pressure relief valve and allowing cryogen from the coil cooling subcircuit to flow into the thermal shield subcircuit, if a pressure difference between the coil cooling subcircuit and the thermal shield subcircuit exceeds a first relief pressure.

34. The method of claim 33, wherein the pressure in the low eddy current circuit is always above atmospheric pressure during operation.

35. The method of claim 34, wherein if the cryocooler fails, cryogen in the cryogen reservoir provides latent cooling for ride-through for at least 4 hours.

36. The method of claim 35, wherein cryogen in the cryogen reservoir provides latent cooling for ride-through for at least 12 hours.

37. An MRI system comprising:
    a superconducting magnet; and
    a low eddy current cryogen circuit, the low eddy current cryogen circuit having at least a first cooling coil in thermal contact with the superconducting magnet and wherein the first cooling coil comprises an electrically conducting material and at least one electrical isolator incorporated in the first cooling coil, the electrical isoloator located to inhibit induced magnetic fields due to inductive coupling of the first cooling coil with the eddy current inducing field sources.

38. The MRI system of claim 37, wherein the superconducting magnet comprises a coil of superconducting material and the first cooling coil is located on an outer surface of the coil of superconducting material.

39. The MRI system of claim 38, wherein the first cooling coil has a plurality of bends in a serpentine shape and wherein the bends in the first cooling coil are angled such that a gas bubble in a liquid in the first cooling tube would f;ow upwards under the force of gravity.

40. The MRI system of claim 39, wherein the low eddy current cryogen circuit further comprises a second cooling coil having at least a second electrical isolator incorporated in the second cooling coil, the second electrical isolator located to inhibit induced magnetic fields due to inductive coupling of the second cooling coil with eddy current inducing field sources, wherein the both the first and second cooling coils have a substantially semicircular portion and the first and second cooling coils are located relative to each other to form a cooling band having a substantially circular shape.

41. The MRI system of claim 40, wherein the low eddy current cryogen circuit further comprises a plurality of cooling bands and at least some of the plurality of cooling bands are incorporated within windings of the superconducting coil.

42. The MRI system of claim 41, further comprising a liquid cryogen reservoir fluidly connected to the first and second cooling coils.

43. The MRI system of claim 42, further comprising at least one thermal shield cooling coil circumscribing the thermal shield, the at least one thermal shield cooling coil having at least one electrical isolator incorporated in the at least one thermal shield cooling coil and located to inhibit induced magnetic fields due to inductive coupling of the at least one thermal shield cooling coil with eddy current inducing field sources.

44. The MRI system of claim 42, further comprising a cryocooler and a condenser thermally connected to the cryocooler, wherein top portions of the first and second cooling coils are fluidly connected to the condenser and wherein the cryocooler comprises two stages, the condenser is thermally connected to the second stage of the crycooler and the thermal shield cooling coil is thermally connected to the first stage of the crycooler.

45. The MRI system of claim 44, further comprising at least one gradient coil and an RF shield.

* * * * *